United States Patent
Wang et al.

(10) Patent No.: US 9,689,947 B2
(45) Date of Patent: Jun. 27, 2017

(54) SAMPLING STRATEGIES FOR SPARSE MAGNETIC RESONANCE IMAGE RECONSTRUCTION

(71) Applicant: Siemens Healthcare GmbH, Erlangen (DE)

(72) Inventors: Qiu Wang, Princeton, NJ (US); Michael Zenge, Nürnberg (DE); Edgar Mueller, Heroldsbach (DE); Mariappan S. Nadar, Plainsboro, NJ (US)

(73) Assignee: Siemens Healthcare GmbH, Erlangen (DE)

( * ) Notice: Subject to any disclaimer, the term of this patent is extended or adjusted under 35 U.S.C. 154(b) by 469 days.

(21) Appl. No.: 14/515,714

(22) Filed: Oct. 16, 2014

(65) Prior Publication Data
US 2015/0108978 A1     Apr. 23, 2015

Related U.S. Application Data

(60) Provisional application No. 61/893,345, filed on Oct. 21, 2013.

(51) Int. Cl.
*G01V 3/00* (2006.01)
*G01R 33/561* (2006.01)
*G01R 33/48* (2006.01)

(52) U.S. Cl.
CPC ...... *G01R 33/5611* (2013.01); *G01R 33/4826* (2013.01)

(58) Field of Classification Search
USPC .......................................... 324/309
See application file for complete search history.

(56) References Cited

U.S. PATENT DOCUMENTS

| | | | | |
|---|---|---|---|---|
| 2013/0156283 A1* | 6/2013 | Beg | ................... | G01N 21/4795 382/131 |
| 2013/0181711 A1* | 7/2013 | Chaari | ............... | G01R 33/5611 324/309 |
| 2014/0097845 A1* | 4/2014 | Liu | ................... | G01R 33/5611 324/322 |

OTHER PUBLICATIONS

"Breaking the coherence barrier: asymptotic incoherence and asymptotic sparsity in compressed sensing" B. Adcock et al.

* cited by examiner

*Primary Examiner* — Rodney Fuller (57) ABSTRACT

A computer-implemented method of selecting a Magnetic Resonance Imaging (MRI) sampling strategy includes selecting a base variable-density sampling pattern and determining a scan time associated with the base variable-density sampling pattern. A modified variable-density sampling pattern is created by modifying one or more parameters of the base variable-density sampling pattern to maximize a sampled k-space area without increasing the scan time. Next, a scan is performed on an object of interest using the modified variable-density sampling pattern to obtain a sparse MRI dataset. Then a sparse reconstruction process is applied to the sparse MRI dataset to yield an image of the object of interest.

20 Claims, 7 Drawing Sheets

SAMPLING STRATEGIES FOR SPARSE MAGNETIC RESONANCE IMAGE RECONSTRUCTION

CROSS-REFERENCE TO RELATED APPLICATIONS

This application claims priority to U.S. provisional application Ser. No. 61/893,345 filed Oct. 21, 2013, which is incorporated herein by reference in its entirety.

TECHNOLOGY FIELD

The present invention relates generally to methods, systems, and apparatuses for determining Magnetic Resonance Imaging (MRI) sampling strategies for use in sparse image reconstruction techniques. The disclosed methods, systems, and apparatuses may be applied, for example, to improve the reconstruction of images with complex anatomical structure and texture while minimizing scan time.

BACKGROUND

Compressed sensing is a collection of techniques for recovering sparse signal and image data from under-sampled data. Traditionally, one requirement for the compressed sensing techniques is that data must be incoherence. Random sampling schemes obey such requirements. However, when working with MRI systems, random sampling is impractical and can potentially hurt the acquisition time due to the physical limitations of present in MRI systems generally and human philological limitations.

Recent theoretical work has shown compressed sensing is possible when data is asymptotically incoherent. As is understood in the art, signal coherence decreases as either the Fourier frequency or wavelet scale increases. Thus, in the MRI domain, incoherence can be asymptotically achieved by increasing the number of high-frequency samples in k-space. Asymptotic incoherence allows one to achieve the benefits of compressed sensing, including significantly sub-sampling the data space, where complete incoherence cannot be achieved. However, to date, asymptotically incoherence has only been demonstrated in simulated environments where the location of sampling points is not limited due to real-world hardware and physiological constraints. Thus, it is desired to create a framework for the selection of optimal sampling strategies applicable to exploiting the asymptotic incoherence properties of image data in real-world scenarios.

SUMMARY

Embodiments of the present invention address and overcome one or more of the above shortcomings and drawbacks, by providing methods, systems, and apparatuses related to determining sampling strategies tailored to achieve asymptotic incoherence in order to improve Magnetic Resonance Imaging (MRI) image quality. Briefly, a conventional sampling pattern is modified to maximize the sampling area to create incoherence while maintaining scan time constraints. Sparsity-based MR reconstruction is then used to create a processed image based on the sampled data.

According to some embodiments of the present invention, a computer-implemented method of selecting a MRI sampling strategy includes selecting a base variable-density sampling pattern (e.g., a spiral phyllotaxis pattern) and determining a scan time associated with that sampling pattern. Various techniques may be used for selecting the base variable-density sampling pattern. For example, in one embodiment, the base pattern is selected from a group of available base patterns based on factors such as the scan time associated with each of the available base pattern. Next, a modified variable-density sampling pattern is created by modifying one or more parameters of the base variable-density sampling pattern to maximize a sampled k-space area without increasing the scan time. In some embodiments, this modified variable-density sampling pattern includes the same number of sampling points as the base pattern. Once the pattern has been modified, a scan is performed on an object of interest using the modified variable-density sampling pattern to obtain a sparse MRI dataset. Then, a sparse reconstruction process is applied to the sparse MRI dataset to yield an image of the object of interest.

The aforementioned method may be modified to include additional features in some embodiments of the present invention. For example, in some embodiments the parameters are modified such that sampling density of a k-space center region is maintained above a threshold value. Additionally, the process for maximizing the sampled k-space area of the modified variable-density sampling pattern in the aforementioned method may vary according to different embodiments. For example, k-space coverage may be expanded along the frequency axis, the phase axis, or some combination of these axes. In one embodiment, the modified variable-density sampling pattern is created, in part, by modifying the parameters to increase a maximum k-space radius of the spiral pattern in at least one of a frequency direction and a phase direction.

According to another aspect of the present invention, as described in some embodiments, an article of manufacture for selecting a MRI sampling strategy includes a non-transitory, tangible computer-readable medium holding computer-executable instructions for performing the aforementioned method. Additionally, the medium may be configured to perform the method with any or all of the additional features of the method described above.

According to other embodiments of the present invention, a system for selecting a MRI sampling strategy includes radio frequency coils, gradient coils, an operator interface, and a central control computer unit. The operator interface is configured to receive a selection of a base variable-density sampling pattern; determine a scan time associated with that base pattern; and create a modified variable-density sampling pattern by modifying parameters of the base sampling pattern to maximize a sampled k-space area without increasing the scan time. The central control computer unit is configured to utilize the radio frequency coils and the gradient coils to perform a scan of an object of interest using the modified variable-density sampling pattern. In some embodiments, the central computer is further configured to acquire a sparse MRI dataset in response to the scan and apply a sparse reconstruction process to generate an image of the object of interest.

Additional features and advantages of the invention will be made apparent from the following detailed description of illustrative embodiments that proceeds with reference to the accompanying drawings.

BRIEF DESCRIPTION OF THE DRAWINGS

The foregoing and other aspects of the present invention are best understood from the following detailed description when read in connection with the accompanying drawings.

For the purpose of illustrating the invention, there is shown in the drawings embodiments that are presently preferred, it being understood, however, that the invention is not limited to the specific instrumentalities disclosed. Included in the drawings are the following Figures.

DETAILED DESCRIPTION OF ILLUSTRATIVE EMBODIMENTS

The following disclosure describes the present invention according to several embodiments directed at methods, systems, and apparatuses that determine sampling strategies tailored to achieve asymptotic incoherence in order to improve image quality. Briefly, for compressed sensing to be successful, sampling must be incoherent and random. In a simulated environment, random sampling procedures may be utilized to achieve incoherence. However, in physical environments it is impossible to perform sampling in the same manner. For example, sampling cannot be random due to factors such as the physical design of the scanner, physiological constraints of the patient, and the need to sample MRI data more densely in the center of k-space. To compensate for the inability to fully randomize the scan, the techniques described herein create a sampling strategy which modifies conventional sampling patterns by increasing the total area that is sampled. As the sample size is increased, incoherence is asymptotically increased and, in turn, the reconstructed image quality is improved. The approach is especially applicable to reconstructing images with complex anatomical structure and texture. However, the process described herein may be utilized in a variety of image reconstruction applications.

Figure 1:
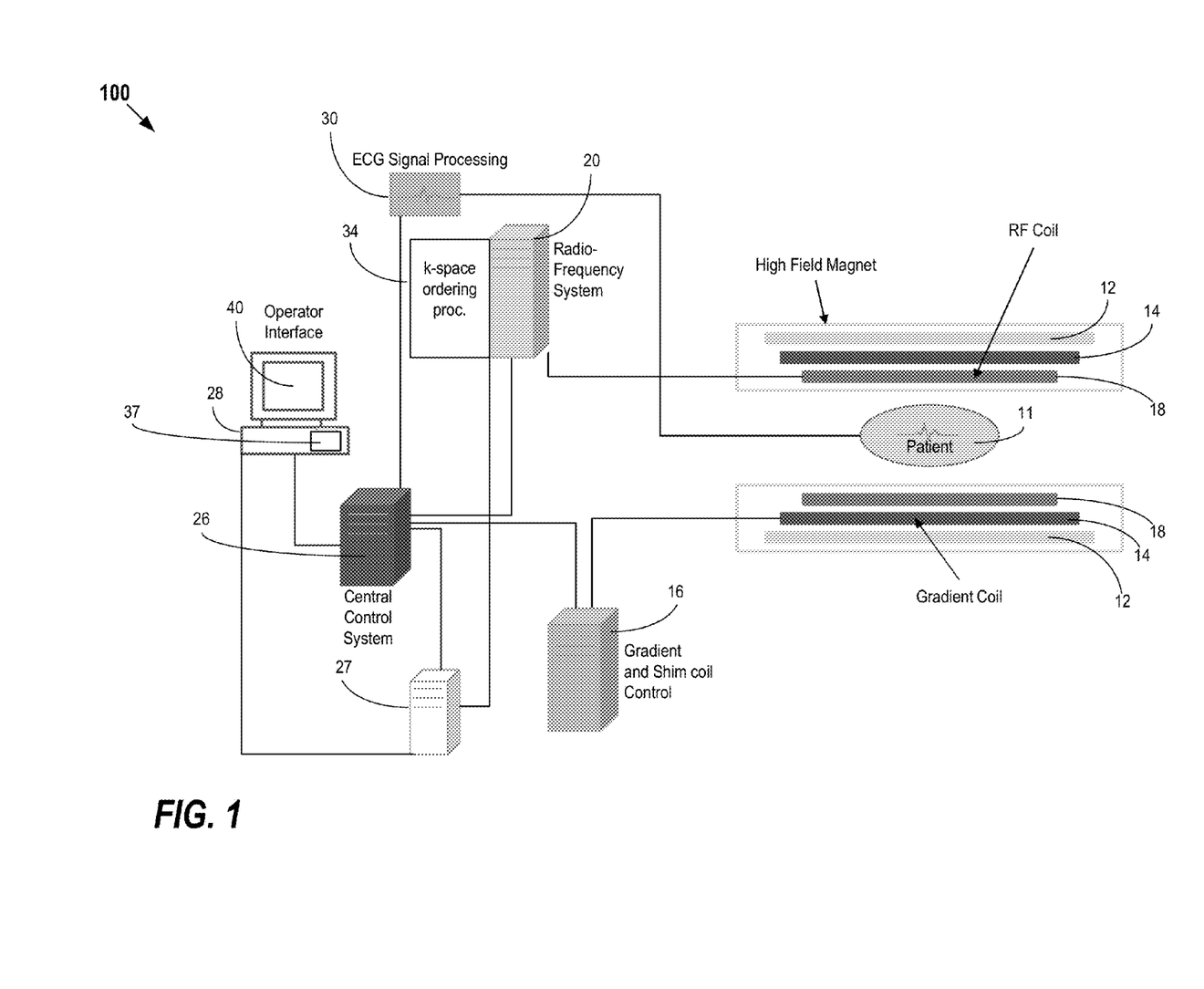
FIG. 1 shows a system for ordering acquisition of frequency domain components representing MR image data for storage in a k-space storage array, as used by some embodiments of the present invention.

FIG. 1 shows a system 100 for ordering acquisition of frequency domain components representing MR image data for storage in a k-space storage array, as used by some embodiments of the present invention. In system 100, magnetic coils 12 create a static base magnetic field in the body of patient 11 to be imaged and positioned on a table. Within the magnet system are gradient coils 14 for producing position dependent magnetic field gradients superimposed on the static magnetic field. Gradient coils 14, in response to gradient signals supplied thereto by a gradient and shim coil control module 16, produce position dependent and shimmed magnetic field gradients in three orthogonal directions and generates magnetic field pulse sequences. The shimmed gradients compensate for inhomogeneity and variability in an MR imaging device magnetic field resulting from patient anatomical variation and other sources. The magnetic field gradients include a slice-selection gradient magnetic field, a phase-encoding gradient magnetic field and a readout gradient magnetic field that are applied to patient 11.

Further RF (radio frequency) module 20 provides RF pulse signals to RF coil 18, which in response produces magnetic field pulses which rotate the spins of the protons in the imaged body of the patient 11 by ninety degrees or by one hundred and eighty degrees for so-called "spin echo" imaging, or by angles less than or equal to 90 degrees for so-called "gradient echo" imaging. Gradient and shim coil control module 16 in conjunction with RF module 20, as directed by central control unit 26, control slice-selection, phase-encoding, readout gradient magnetic fields, radio frequency transmission, and magnetic resonance signal detection, to acquire magnetic resonance signals representing planar slices of patient 11. As described in greater detail below, in some embodiments, the central control unit 26 directs the various components of the system 100 to perform such activity based on a sampling strategy corresponding to a variable-density sampling pattern.

In response to applied RF pulse signals, the RF coil 18 receives MR signals, i.e., signals from the excited protons within the body as they return to an equilibrium position established by the static and gradient magnetic fields. The MR signals are detected and processed by a detector within RF module 20 and k-space component processor unit 34 to provide an MR dataset to an image data processor for processing into an image. In some embodiments, the image data processor is located in central control unit 26. However, in other embodiments such as the one depicted in FIG. 1, the image data processor is located in a separate unit 27. ECG synchronization signal generator 30 provides ECG signals used for pulse sequence and imaging synchronization. A two or three dimensional k-space storage array of individual data elements in k-space component processor unit 34 stores corresponding individual frequency components comprising an MR dataset. The k-space array of individual data elements has a designated center and individual data elements individually have a radius to the designated center;

A magnetic field generator (comprising coils 12, 14 and 18) generates a magnetic field for use in acquiring multiple individual frequency components corresponding to individual data elements in the storage array. The individual frequency components are successively acquired in an order in which radius of respective corresponding individual data elements increases and decreases along a substantially spiral path as the multiple individual frequency components is sequentially acquired during acquisition of an MR dataset representing an MR image. A storage processor in the k-space component processor unit 34 stores individual frequency components acquired using the magnetic field in corresponding individual data elements in the array. The radius of respective corresponding individual data elements alternately increases and decreases as multiple sequential individual frequency components are acquired. The magnetic field acquires individual frequency components in an order corresponding to a sequence of substantially adjacent individual data elements in the array and magnetic field gradient change between successively acquired frequency components is substantially minimized.

Central control unit 26 uses information stored in an internal database to process the detected MR signals in a coordinated manner to generate high quality images of a selected slice(s) of the body (e.g., using the image data processor) and adjusts other parameters of system 100. The stored information comprises predetermined pulse sequence and magnetic field gradient and strength data as well as data indicating timing, orientation and spatial volume of gradient magnetic fields to be applied in imaging. Generated images are presented on display 40 of the operator interface. Computer 28 of the operator interface includes a graphical user interface (GUI) enabling user interaction with central control unit 26 and enables user modification of magnetic resonance imaging signals in substantially real time. Display processor 37 processes the magnetic resonance signals to provide image representative data for display on display 40, for example.

The system 100 described in FIG. 1 may be used to reconstruct data based on under-sampled k-space data using compressed sensing techniques. However, as is understood in the art, such techniques require the measurement in k-space to be incoherent. Although it is difficult to achieve perfect incoherence, it is possible to achieve asymptotic incoherence when the sampling size is large. When the problem size is small, there may be little to be gained from compressed sensing over classical linear reconstruction techniques. However, once the resolution of the problem is sufficiently large, compressed sensing can offer a substantial advantage, which is so-called resolution dependence. When the same total number of samples in k-space is measured at low resolution as at high resolution, the higher resolution reconstruction will yield substantially better results. This is true because a multilevel random sampling strategy successfully exploits asymptotic sparsity and asymptotic incoherence. Thus, with the same amount of total effort (i.e., the same number of k-space measurements) compressed sensing with multilevel sampling works as a resolution enhancer by allowing recovery of the fine details of an image in a way that is not possible with the lower resolution reconstruction.

Using the techniques described herein, multilevel random sampling strategies applicable to real-world scenarios can be developed using conventional sampling patterns. In computer simulations, for example, one can place a sample at any point in k-space. However, in clinical settings, the analysis is limited by factors such as the physical limitations of the scanner and physiological characteristics of the patient. To address these factors, the techniques described herein develop sampling strategies which modify conventional sampling patterns to achieve asymptotic incoherence and, thus, make the sampled data available for sparsity-based MR reconstruction techniques.

It should be noted that net acceleration factor associated with the selected sampling pattern is fixed to maintain the speed. In the context of parallel imaging techniques, the net acceleration factor refers to the factor by which scan time is reduced compared to standing imaging. However, using the techniques described herein, the speed is maintained while acquiring a higher resolution image. Instead of sampling at lower sampling frequencies, the higher sampling frequencies are sampled, while keeping density in the center of k-space. If density is not maintained, higher resolution images may be acquired, but with artifacts.

Figure 2:
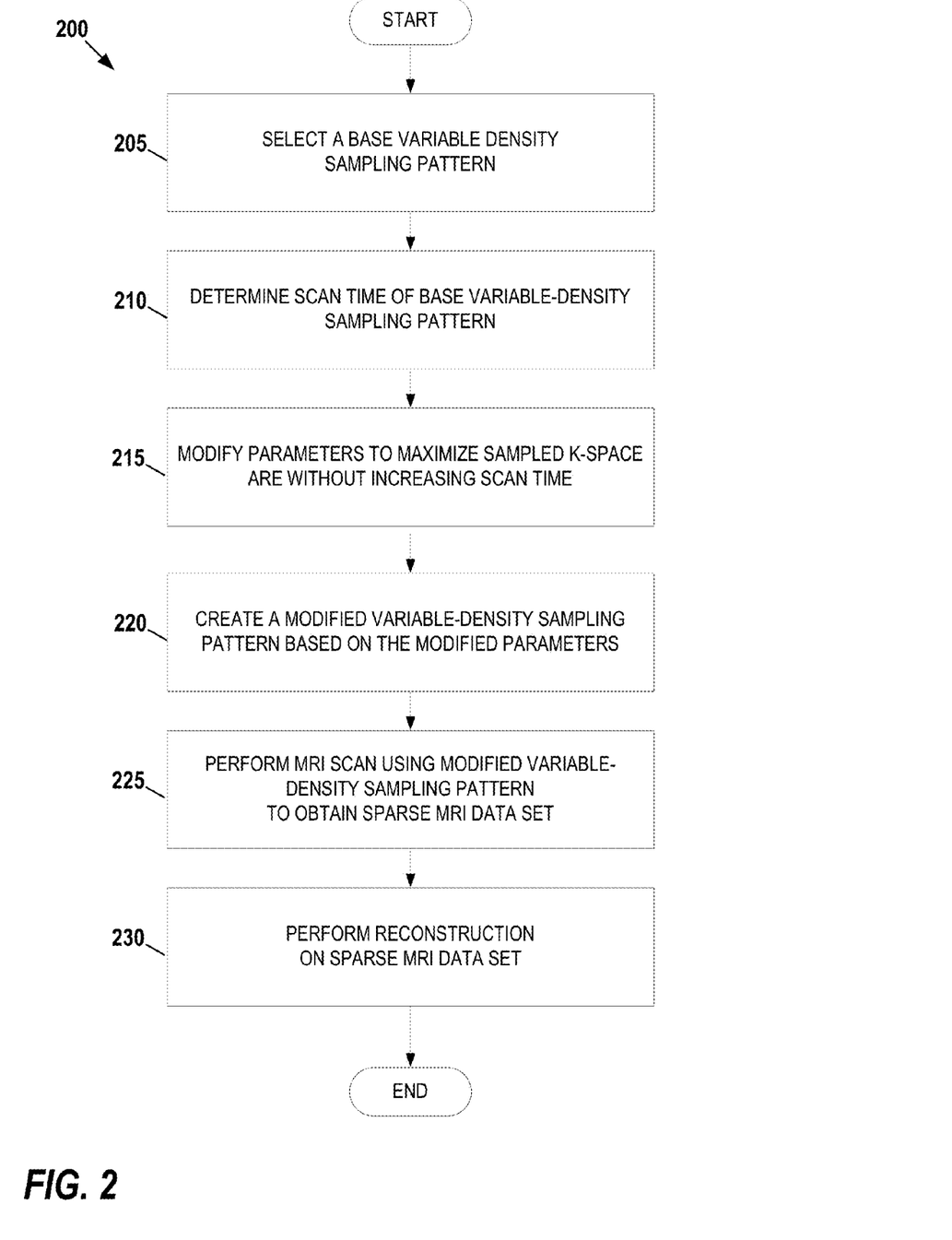
FIG. 2 provides an example of a process for determining a sampling strategy for achieving asymptotic incoherence, according to some embodiments of the present invention.

FIG. 2 provides an example of a process 200 for determining a sampling strategy for achieving asymptotic incoherence, according to some embodiments of the present invention. The process 200 begins as 205 where a "base" variable-density sampling pattern is selected from one or more conventional sampling patterns. As is understood in the art, variable-density sampling patterns are used to regionally undersample k-space. In the example of FIG. 2, the base variable-density sampling pattern is a spiral phyllotaxis sampling pattern (illustrated in greater detail below with respect to FIG. 3). However, it should be understood that the spiral phyllotaxis sampling pattern is merely one example of the sampling patterns that may be used with the techniques described herein. In general, any conventional variable-density sampling pattern known in the art may be selected at 205. Thus, in some embodiments, the sampling pattern may be selected based on one or more criteria of the operator. For example, the pattern may be selected at the outset based on other factors such as the speed of the scan and sampling density required to achieve the desired Field of View (FOV).

At 210, the scan time of the base variable density sampling pattern is determined. This determination may be performed, for example, based on a simulation analysis of the pattern for a particular set of conditions (e.g., hardware constraints, physiological details, etc.). Alternatively, the scan time may be pre-determined and specified in a file which may be read upon selection of the base pattern. The scan time indicates how long it will take an MR imaging device (see, e.g., FIG. 1) to sample data using the pattern.

One way of increasing the number of samples is simply to sample more data. However, this would result in an increase to the scan time value. This is likely unacceptable in most clinical scenarios since the increase in scan time may 1) introduce unwanted image artifacts and blurring due to motion of object being scanned, 2) decrease the possible temporal resolution of the dynamic acquisition, and 3) prolong patient time spent on the scanner. Thus, at 215, the parameters of the base variable-density sampling pattern are modified to maximize the sampled k-space area without increasing scan time. During this modification, the effects on density in the center region of k-space must also be considered since changes to sampling in that region will affect image quality. Continuing with the example of a spiral sampling pattern, the modification performed at 215 may result in maximum values for the radii in the x and y directions (i.e., the frequency and phase directions) which maintain a desired minimum density in the center of k-space. Thus, the modified parameters may be the maximum x and y radius values, along with a modified function defining the radial density variation.

In some embodiments, these parameters may be identified and modified based on pre-determined knowledge about each pattern. For example, a data file may be maintained with information about which parameters are related to increasing the sampled area of k-space and maximum/minimum values for those parameters which maintain a threshold density of the center k-space region. In other embodiments, techniques may be used to identify and modify the parameters based on their use in an optimization algorithm or simulated scan. For example, in one embodiment, an optimization formula is iteratively applied to each parameter until k-space area is maximized. This formula may be constrained, for example, based on predetermined requirements regarding image quality. Additionally, in some embodiments, the direction of which k-space is maximized may be taken into consideration. For example, depending on the application, the operator may request maximization along just the phase or frequency axis. Alternatively, the operator can specify certain proportions (e.g., maximize the area such that it increases twice as much in the frequency direction than the phase direction).

After the parameters have been modified, at 220, the parameters are used to create a modified variable-density sampling pattern. This modified pattern may then be used to generate a trajectory which defines the path traced in the spatial-frequency domain during data collection. For example, for the spiral phyllotaxis sampling pattern, this trajectory will define the points on the spiral. Next, at 225, a MRI scan is performed using the trajectory to acquire a sparse MRI data set. The MRI scan may be performed, for example using, the system 100 illustrated in FIG. 1. Continuing with reference to FIG. 2, at 230, a reconstruction is performed using the sparse MRI data set. The sampling strategy discussed above utilizes the sparse reconstruction process to take full advantage of the high frequency components. For example, in some embodiments, the sampling pattern utilizes the same number of samples but spreads them over a larger area to increase incoherence. Without using a sparse reconstruction technique, the benefits of this increase may not be apparent since the number of data samples remained fixed. In some embodiments, a SENSE reconstruction with a sparse prior is performed at 230. For example, in one embodiment, the reconstruction process is based on the following minimization:

$$\min_{\infty} \frac{1}{2} \sum_{i=1}^{N_c} \|F_u(c_i \odot x) - y\|_2^2 + \lambda \|Wx\|_1 \quad (1)$$

In Equation 1, x is a one-dimensional vector which is the vectorized version of the signal to be reconstructed (e.g., an image). The vector x may be generated, for example, by concatenating columns of the signal together vertically. For dynamic imaging, the signal to be reconstructed is three-dimensional if the data is a time sequence of two-dimensional images, or four dimensional if the data is a time sequence of three-dimensional images. $N_c$ is the number of coils used by the MR device. $F_u$ is an operator for image acquisition which includes Fourier transform and undersampling in k-space. The term $c_i$ is the coil sensitivity profile for the ith coil, and y is the acquired k-space data written in the vectorized form. The regularization term $\lambda \|Wx\|_1$ is the $l_1$-arm of the signal in the transform domain, where W represents the redundant Haar wavelet transform and X is a regularization parameter governing the tradeoff between the data fidelity and its sparsity.

Figure 3A:
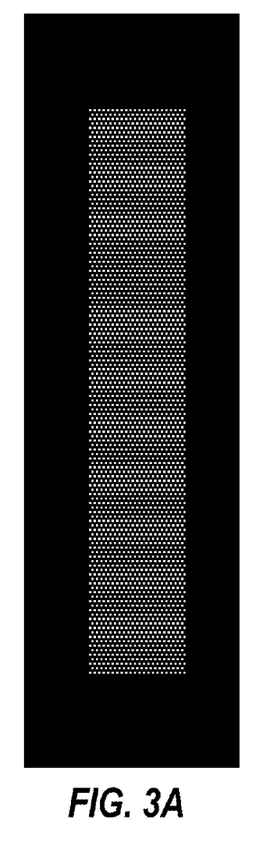
FIG. 3A is the sampling mask for CAIPIRINHA 4 viewed in the two phase encoding planes.
Figure 3B:
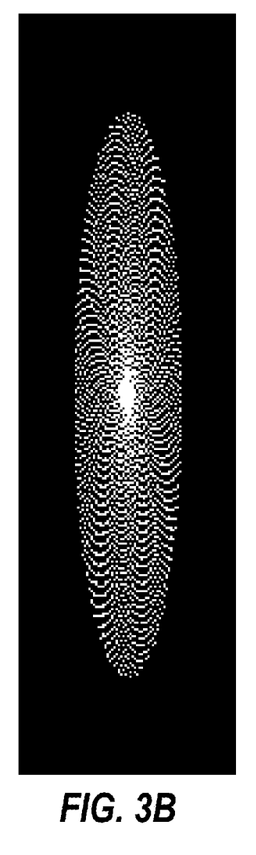
FIG. 3B is an incoherent sampling mask with 3139 sampled lines and net acceleration factor of 3.9, as may be used in some embodiments of the present invention.

FIGS. 3A-3D provide illustrations of the plots the origin of frequency encoding lines of the patterns in the kx-ky phase encoding plane, according to some embodiments of the present invention. FIG. 3A shows a CAIPIRINHA (Controlled Aliasing in Parallel Imaging Results in Higher Acceleration) pattern with a total number of 2731 k-space lines as the standard of reference. Note that FIG. 3A includes a significant amount of zero padding in the kx and ky directions. FIG. 3B shows a variable-density spiral phyllotaxis pattern with 3139 sampled lines. Use of the patterns illustrated in FIG. 3A and FIG. 3B will result in identical values for the highest spatial frequencies.

Figure 3C:
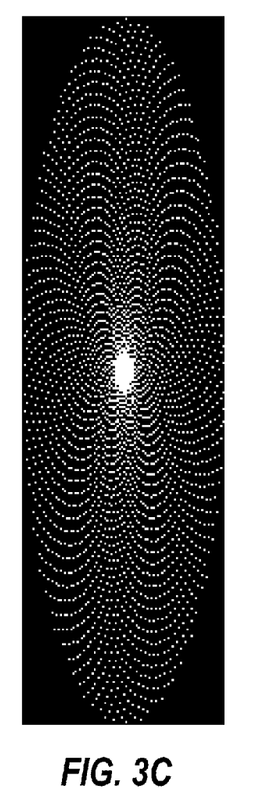
FIG. 3C is an incoherent sampling mask with the spacing along the first phase encoding direction increased to sample at higher frequencies in that direction, according to some embodiments of the present invention.
Figure 3D:
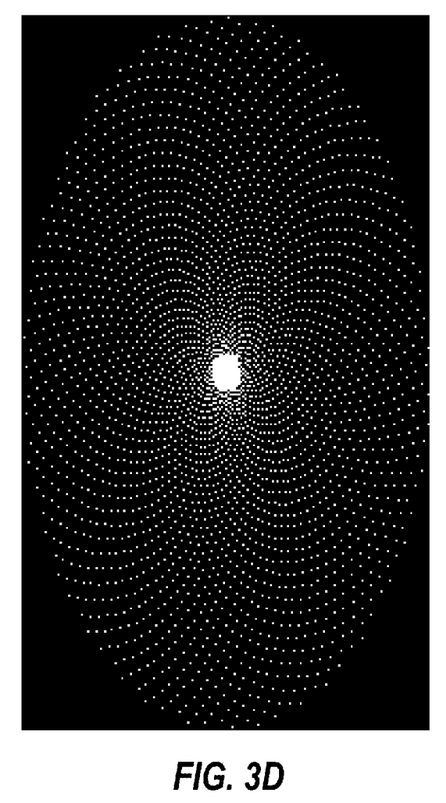
FIG. 3D is an incoherent sampling mask again where the two phase encoding direction has been extended with samples going further into higher frequency Fourier.
Figure 4A:
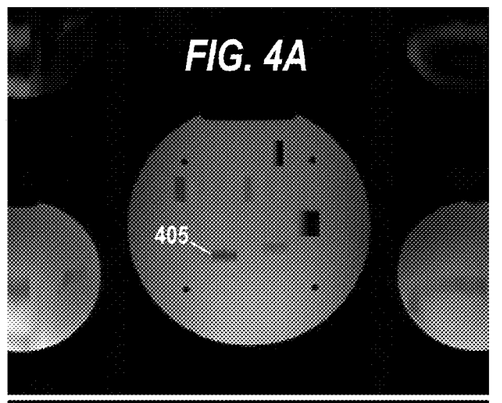
FIG. 4A results from coherent sampling of phantom data using the sampling mask illustrated in FIG. 3A.
Figure 4B:
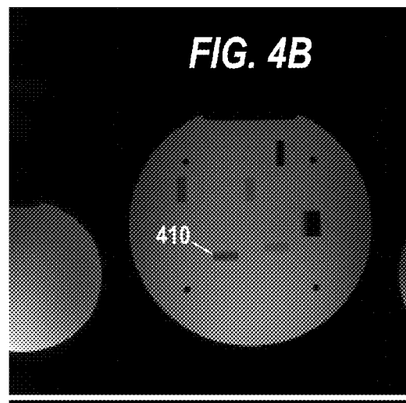
FIG. 4B results from basic coherent sampling of phantom data using the sampling mask illustrated in FIG. 3B.
Figure 4C:
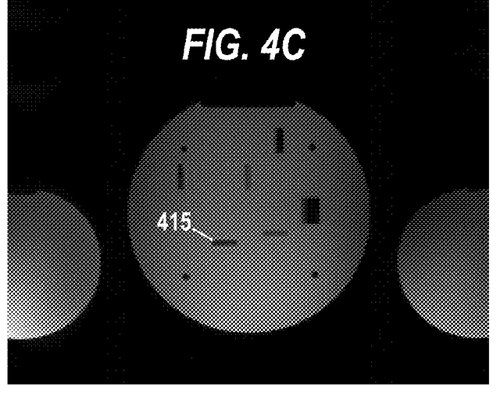
FIG. 4C results from incoherent sampling with extended phase encoding measurements of phantom data using the sampling mask illustrated in FIG. 3C, according to some embodiments of the present invention.
Figure 4D:
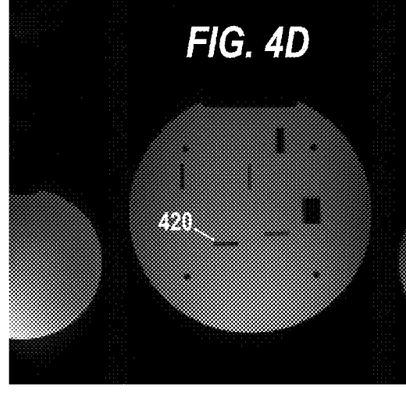
FIG. 4D results from incoherent sampling with extended phase encoding measurements of phantom data using the sampling mask illustrated in FIG. 3D, according to some embodiments of the present invention.

FIG. 3C provides an illustration of the variable-density spiral phyllotaxis pattern with 3139 readouts redistributed to cover higher spatial frequencies. The reconstructed resolution was identical for (a)-(c). Using the techniques described herein the pattern shown in FIG. 3C results in a reconstructed resolution which is similar to that provided by the patterns of FIGS. 3A and 3B. FIG. 3D shows another illustration of the variable-density spiral phyllotaxis pattern with 3139 k-space lines, but increased spatial resolution in the partition dimension by a factor of two.

Figure 5A:
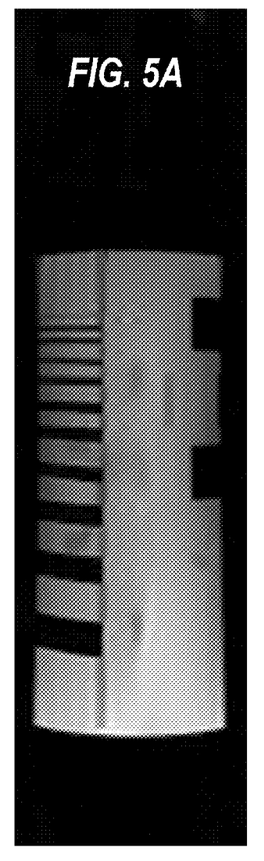
FIG. 5A shows a sagittal reformation of the data illustrated in FIG. 4A.
Figure 5B:
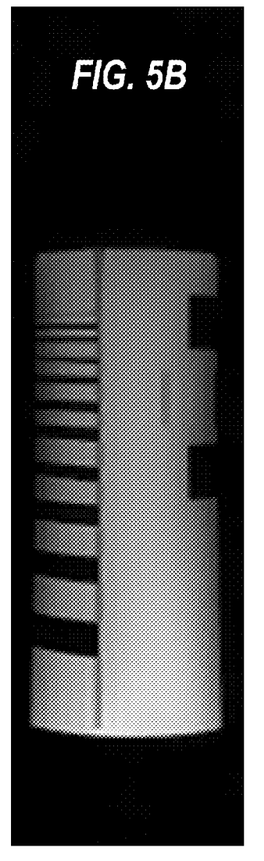
FIG. 5B shows a sagittal reformation of the data illustrated in FIG. 4B.
Figure 5C:
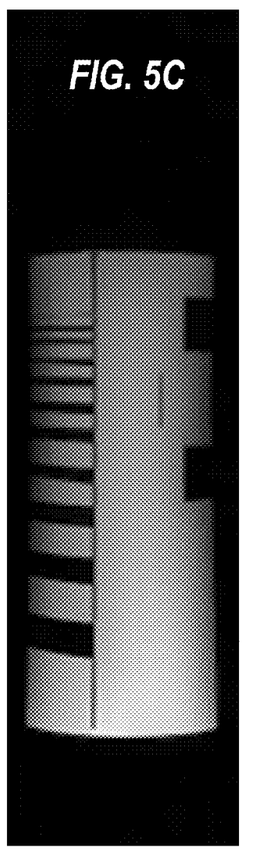
FIG. 5C shows a sagittal reformation of the data illustrated in FIG. 4C.
Figure 5D:
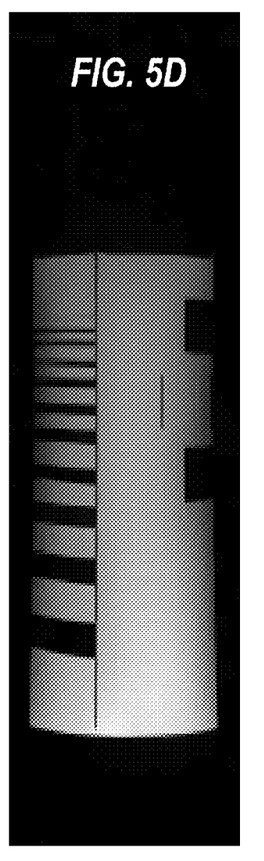
FIG. 5D shows a sagittal reformation of the data illustrated in FIG. 4D.

FIGS. 4A-4D shows the results from the phantom data, displayed in the axial plane, comparing the sampling patterns shown in FIG. 3A-3D, respectively, according to some embodiments of the present invention. The image resolution has been greatly improved from the image shown in FIG. 2A (coherent sampling) and FIG. 2B (basic incoherent sampling) to FIGS. 2C and 2D (incoherent sampling with extended phase encoding measurements). This improvement is especially apparent around thin rectangles 405, 410, 415, and 420 marked in each respective figure. FIGS. 5A-5D show a sagittal reformation of the data illustrated in FIGS. 4A-4D, as may be generated using some of the embodiments described herein. As shown in FIGS. 5C and 5D, the increase in spatial resolution is even more apparent compared to FIGS. 5A and 4B.

Figure 6:
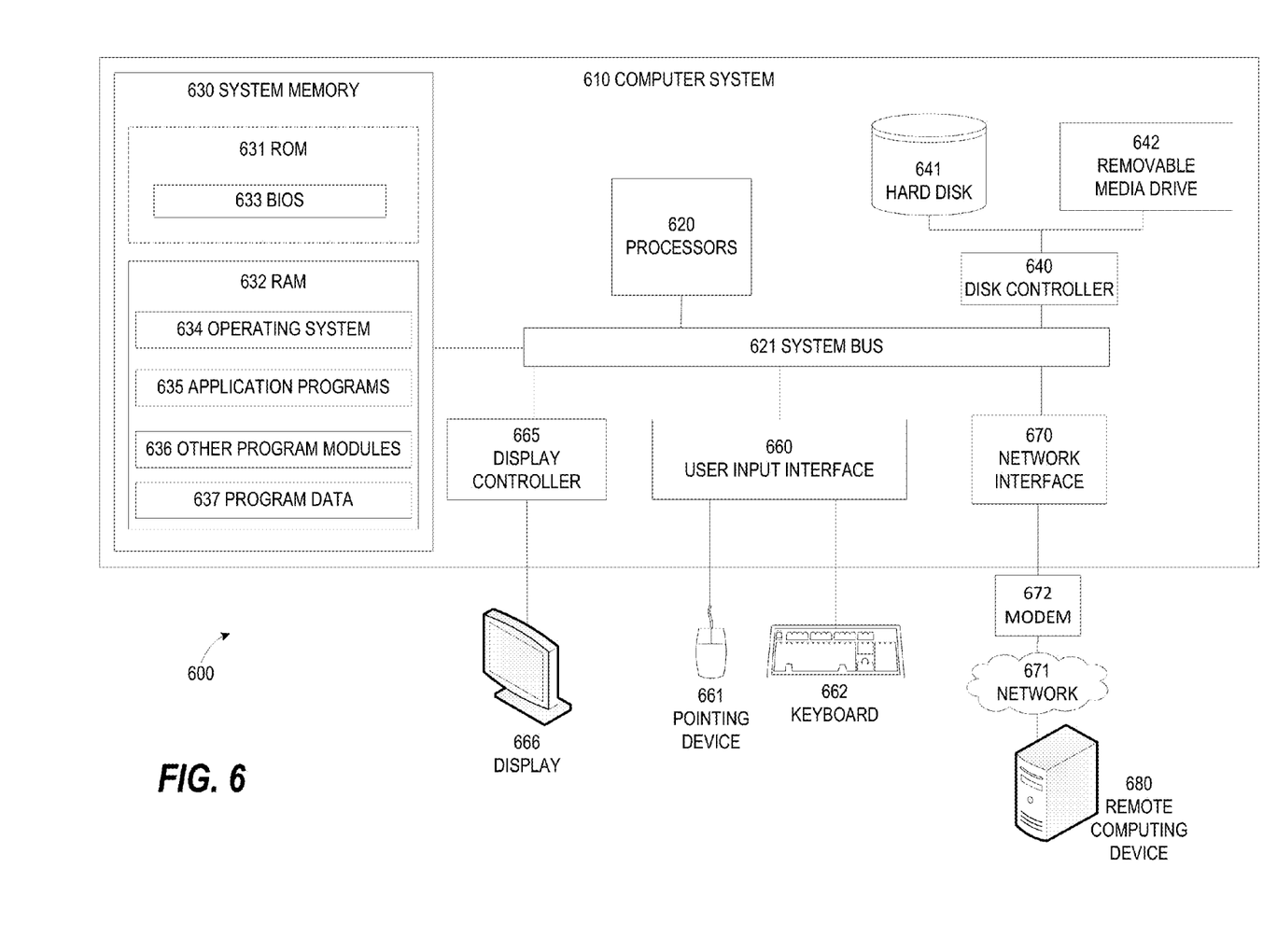
FIG. 6 illustrates an exemplary computing environment within which embodiments of the invention may be implemented.

FIG. 6 illustrates an exemplary computing environment 600 within which embodiments of the invention may be implemented. For example, this computing environment 600 may be used to implement the process 200 of determining a sampling strategy described in FIG. 2. In some embodiments, the computing environment 600 may be used to implement one or more of the components illustrated in the system 100 of FIG. 1. The computing environment 600 may include computer system 610, which is one example of a computing system upon which embodiments of the invention may be implemented. Computers and computing environments, such as computer system 610 and computing environment 600, are known to those of skill in the art and thus are described briefly here.

As shown in FIG. 6, the computer system 610 may include a communication mechanism such as a bus 621 or other communication mechanism for communicating information within the computer system 610. The computer system 610 further includes one or more processors 620 coupled with the bus 621 for processing the information. The processors 620 may include one or more central processing units (CPUs), graphical processing units (GPUs), or any other processor known in the art.

The computer system 610 also includes a system memory 630 coupled to the bus 621 for storing information and instructions to be executed by processors 620. The system memory 630 may include computer readable storage media in the form of volatile and/or nonvolatile memory, such as read only memory (ROM) 631 and/or random access memory (RAM) 632. The system memory RAM 632 may include other dynamic storage device(s) (e.g., dynamic RAM, static RAM, and synchronous DRAM). The system memory ROM 631 may include other static storage device (s) (e.g., programmable ROM, erasable PROM, and electrically erasable PROM). In addition, the system memory 630 may be used for storing temporary variables or other intermediate information during the execution of instructions by the processors 620. A basic input/output system 633 (BIOS) containing the basic routines that help to transfer information between elements within computer system 610, such as during start-up, may be stored in ROM 631. RAM 632 may contain data and/or program modules that are immediately accessible to and/or presently being operated on by the processors 620. System memory 630 may additionally include, for example, operating system 634, application programs 635, other program modules 636 and program data 637.

The computer system 610 also includes a disk controller 640 coupled to the bus 621 to control one or more storage devices for storing information and instructions, such as a hard disk 641 and a removable media drive 642 (e.g., floppy disk drive, compact disc drive, tape drive, and/or solid state drive). The storage devices may be added to the computer system 610 using an appropriate device interface (e.g., a small computer system interface (SCSI), integrated device electronics (IDE), Universal Serial Bus (USB), or FireWire).

The computer system 610 may also include a display controller 665 coupled to the bus 621 to control a display 666, such as a cathode ray tube (CRT) or liquid crystal display (LCD), for displaying information to a computer user. The computer system includes an input interface 660 and one or more input devices, such as a keyboard 662 and a pointing device 661, for interacting with a computer user and providing information to the processor 620. The pointing device 661, for example, may be a mouse, a trackball, or a pointing stick for communicating direction information and command selections to the processor 620 and for controlling cursor movement on the display 666. The display 666 may provide a touch screen interface which allows input to supplement or replace the communication of direction information and command selections by the pointing device 661.

The computer system 610 may perform a portion or all of the processing steps of embodiments of the invention in response to the processors 620 executing one or more sequences of one or more instructions contained in a memory, such as the system memory 630. Such instructions may be read into the system memory 630 from another computer readable medium, such as a hard disk 641 or a removable media drive 642. The hard disk 641 may contain one or more datastores and data files used by embodiments of the present invention. Datastore contents and data files may be encrypted to improve security. The processors 620 may also be employed in a multi-processing arrangement to execute the one or more sequences of instructions contained in system memory 630. In alternative embodiments, hard-wired circuitry may be used in place of or in combination with software instructions. Thus, embodiments are not limited to any specific combination of hardware circuitry and software.

As stated above, the computer system 610 may include at least one computer readable medium or memory for holding instructions programmed according embodiments of the invention and for containing data structures, tables, records, or other data described herein. The term "computer readable medium" as used herein refers to any medium that participates in providing instructions to the processor 620 for execution. A computer readable medium may take many forms including, but not limited to, non-volatile media, volatile media, and transmission media. Non-limiting examples of non-volatile media include optical disks, solid state drives, magnetic disks, and magneto-optical disks, such as hard disk 641 or removable media drive 642. Non-limiting examples of volatile media include dynamic memory, such as system memory 630. Non-limiting examples of transmission media include coaxial cables, copper wire, and fiber optics, including the wires that make up the bus 621. Transmission media may also take the form of acoustic or light waves, such as those generated during radio wave and infrared data communications.

The computing environment 600 may further include the computer system 610 operating in a networked environment using logical connections to one or more remote computers, such as remote computer 680. Remote computer 680 may be a personal computer (laptop or desktop), a mobile device, a server, a router, a network PC, a peer device or other common network node, and typically includes many or all of the elements described above relative to computer system 610. When used in a networking environment, computer system 610 may include modem 672 for establishing communications over a network 671, such as the Internet. Modem 672 may be connected to bus 621 via user network interface 670, or via another appropriate mechanism.

Network 671 may be any network or system generally known in the art, including the Internet, an intranet, a local area network (LAN), a wide area network (WAN), a metropolitan area network (MAN), a direct connection or series of connections, a cellular telephone network, or any other network or medium capable of facilitating communication between computer system 610 and other computers (e.g., remote computer 680). The network 671 may be wired, wireless or a combination thereof. Wired connections may be implemented using Ethernet, Universal Serial Bus (USB), RJ-11 or any other wired connection generally known in the art. Wireless connections may be implemented using Wi-Fi, WiMAX, and Bluetooth, infrared, cellular networks, satellite or any other wireless connection methodology generally known in the art. Additionally, several networks may work alone or in communication with each other to facilitate communication in the network 671.

The embodiments of the present disclosure may be implemented with any combination of hardware and software. In addition, the embodiments of the present disclosure may be included in an article of manufacture (e.g., one or more computer program products) having, for example, computer-readable, non-transitory media. The media has embodied therein, for instance, computer readable program code for providing and facilitating the mechanisms of the embodiments of the present disclosure. The article of manufacture can be included as part of a computer system or sold separately.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

An executable application, as used herein, comprises code or machine readable instructions for conditioning the processor to implement predetermined functions, such as those of an operating system, a context data acquisition system or other information processing system, for example, in response to user command or input. An executable procedure is a segment of code or machine readable instruction, sub-routine, or other distinct section of code or portion of an executable application for performing one or more particular processes. These processes may include receiving input data and/or parameters, performing operations on received input data and/or performing functions in response to received input parameters, and providing resulting output data and/or parameters.

A graphical user interface (GUI), as used herein, comprises one or more display images, generated by a display processor and enabling user interaction with a processor or other device and associated data acquisition and processing functions. The GUI also includes an executable procedure or executable application. The executable procedure or executable application conditions the display processor to generate signals representing the GUI display images. These signals are supplied to a display device which displays the image for viewing by the user. The processor, under control of an executable procedure or executable application, manipulates the GUI display images in response to signals received from the input devices. In this way, the user may interact with the display image using the input devices, enabling user interaction with the processor or other device.

The functions and process steps herein may be performed automatically or wholly or partially in response to user command. An activity (including a step) performed automatically is performed in response to one or more executable instructions or device operation without user direct initiation of the activity.

The system and processes of the figures are not exclusive. Other systems, processes and menus may be derived in accordance with the principles of the invention to accomplish the same objectives. Although this invention has been described with reference to particular embodiments, it is to be understood that the embodiments and variations shown and described herein are for illustration purposes only. Modifications to the current design may be implemented by those skilled in the art, without departing from the scope of the invention. As described herein, the various systems, subsystems, agents, managers and processes can be implemented using hardware components, software components, and/or combinations thereof. No claim element herein is to be construed under the provisions of 35 U.S.C. 112, sixth paragraph, unless the element is expressly recited using the phrase "means for."

We claim:

1. A computer-implemented method of selecting a Magnetic Resonance Imaging (MRI) sampling strategy, the method comprising:
    selecting a base variable-density sampling pattern;
    determining a scan time associated with the base variable-density sampling pattern;
    creating a modified variable-density sampling pattern by modifying one or more parameters of the base variable-density sampling pattern to maximize a sampled k-space area without increasing the scan time;
    performing a scan on an object of interest using the modified variable-density sampling pattern to obtain a sparse MRI dataset; and
    applying a sparse reconstruction process to the sparse MRI dataset to yield an image of the object of interest.

2. The method of claim 1, further comprising:
    modifying the one or more parameters of the base variable-density sampling pattern during creation of the modified variable-density sampling pattern such that sampling density of a k-space center region is maintained above a threshold value.

3. The method of claim 1, wherein the base variable-density sampling pattern is a spiral pattern.

4. The method of claim 3, wherein the spiral pattern is a spiral phyllotaxis pattern.

5. The method of claim 3, wherein modification of the base variable-density sampling pattern to create the modified variable-density sampling pattern comprises:
    modifying the one or more parameters to increase a maximum k-space radius of the spiral pattern in at least one of a frequency direction and a phase direction.

6. The method of claim 1, wherein maximizing the sampled k-space area expands k-space coverage of the modified variable-density sampling pattern along a frequency axis.

7. The method of claim 1, wherein maximizing the sampled k-space area comprises expanding k-space coverage of the modified variable-density sampling pattern along a phase axis.

8. The method of claim 1, wherein the base variable-density sampling pattern and the modified variable-density sampling pattern correspond to an identical number of sampling points.

9. The method of claim 1, wherein the base variable-density sampling pattern is selected from a plurality of variable density sampling patterns based on a distinctive scan time value associated with each respective base variable-density sampling patterns.

10. An article of manufacture for selecting a Magnetic Resonance Imaging (MRI) sampling strategy, the article of manufacture comprising a non-transitory, tangible computer-readable medium holding computer-executable instructions for performing a method comprising:
    receiving a selection of a base variable-density sampling pattern;
    determining a scan time associated with the base variable-density sampling pattern;
    creating a modified variable-density sampling pattern by modifying one or more parameters of the base variable-density sampling pattern to maximize a sampled k-space area without increasing the scan time;
    sending one or more instructions to an MRI device to acquire one or more images of an object of interest using the modified variable-density sampling pattern and a sparse reconstruction process; and
    receiving the one or more images of the object of interest in response to the one or more instructions.

11. The article of manufacture of claim 10, wherein the method further comprises:
    modifying the one or more parameters of the base variable-density sampling pattern during creation of the modified variable-density sampling pattern such that sampling density of a k-space center region is maintained above a threshold value.

12. The article of manufacture of claim 10, wherein the base variable-density sampling pattern is a spiral pattern.

13. The article of manufacture of claim 12, wherein the spiral pattern is a spiral phyllotaxis pattern.

14. The article of manufacture of claim 12, wherein modification of the base variable-density sampling pattern to create the modified variable-density sampling pattern comprises:
    modifying the one or more parameters to increase a maximum k-space radius of the spiral pattern in at least one of a frequency direction and a phase direction.

15. The article of manufacture of claim 10, wherein maximizing the sampled k-space area expands k-space coverage of the modified variable-density sampling pattern along a frequency axis.

16. The article of manufacture of claim 10, wherein maximizing the sampled k-space area comprises expanding k-space coverage of the modified variable-density sampling pattern along a phase axis.

17. The article of manufacture of claim 10, wherein the base variable-density sampling pattern and the modified variable-density sampling pattern correspond to an identical number of sampling points.

18. The article of manufacture of claim 10, wherein the base variable-density sampling pattern is selected from a plurality of variable density sampling patterns based on a distinctive scan time value associated with each respective base variable-density sampling patterns.

19. A system for selecting a Magnetic Resonance Imaging (MRI) sampling strategy, the system comprising:
   a plurality of radio frequency coils;
   a plurality of gradient coils;
   an operator interface configured to:
      receive a selection of a base variable-density sampling pattern,
      determine a scan time associated with the base variable-density sampling pattern,
      create a modified variable-density sampling pattern by modifying one or more parameters of the base variable-density sampling pattern to maximize a sampled k-space area without increasing the scan time; and
   a central control computer unit configured to utilize the plurality of radio frequency coils and the plurality of gradient coils to perform a scan of an object of interest using the modified variable-density sampling pattern.

20. The system of claim 19, wherein the central control computer unit is further configured to:
   acquire a sparse MRI dataset in response to the scan, and
   apply a sparse reconstruction process to the sparse MRI dataset to yield an image of the object of interest.

* * * * *